United States Patent [19]
Fukushima

[11] Patent Number: 5,459,508
[45] Date of Patent: Oct. 17, 1995

[54] IMAGE PROCESSING APPARATUS

[75] Inventor: Nobuo Fukushima, Yokohama, Japan

[73] Assignee: Canon Kabushiki Kaisha, Tokyo, Japan

[21] Appl. No.: 172,375

[22] Filed: Dec. 22, 1993

[30] Foreign Application Priority Data

Dec. 28, 1992 [JP] Japan ................................. 4-361631

[51] Int. Cl.[6] ..................................................... H04N 1/00
[52] U.S. Cl. ........................ 348/243; 348/241; 348/243; 348/232; 358/446; 358/482; 395/164; 395/166; 395/433; 395/425
[58] Field of Search .................................... 358/335, 342, 358/167, 475, 446; 348/222, 231, 233, 241, 243, 239, 249, 250; 395/164, 166, 425

[56] References Cited

U.S. PATENT DOCUMENTS

| | | | |
|---|---|---|---|
| 4,819,213 | 4/1989 | Yamaguchi et al. | 365/233 |
| 4,823,120 | 4/1989 | Thompson et al. | 345/199 |
| 5,034,981 | 7/1991 | Leonard et al. | 380/5 |
| 5,067,097 | 11/1991 | Yamazaki et al. | 395/166 |
| 5,325,331 | 6/1994 | Parkinson et al. | 365/189.06 |

Primary Examiner—Edward L. Coles, Sr.
Assistant Examiner—Fan Lee
Attorney, Agent, or Firm—Fitzpatrick, Cella, Harper & Scinto

[57] ABSTRACT

An image processing apparatus having a solid state image sensor for inputting an optical image thereto and converting the image into an electrical signal; an image memory having a general-purpose DRAM formed by at least one chip and required to control the refresh operation from the outside of the memory chip; a timing signal generator for generating timing of read from the solid state image sensor; a transfer/ storage control device for horizontally reading data from the solid state image sensor synchronously with the horizontal read timing signal generated from the timing signal generator, transferring the read data and storing the data in the DRAM; a first refresh signal generator for refreshing the DRAM at predetermined time intervals when no data is read from the solid state image sensor; and a second refresh signal generator for refreshing the DRAM a predetermined number of times during the dormant period of the horizontal read timing signal. In the apparatus, the second refresh signal generator is made effective synchronously with the horizontal read timing signal during the time of read from the solid state image sensor, and the first refresh signal generator is made effective during a time other than the time of read from the solid state image sensor.

7 Claims, 14 Drawing Sheets

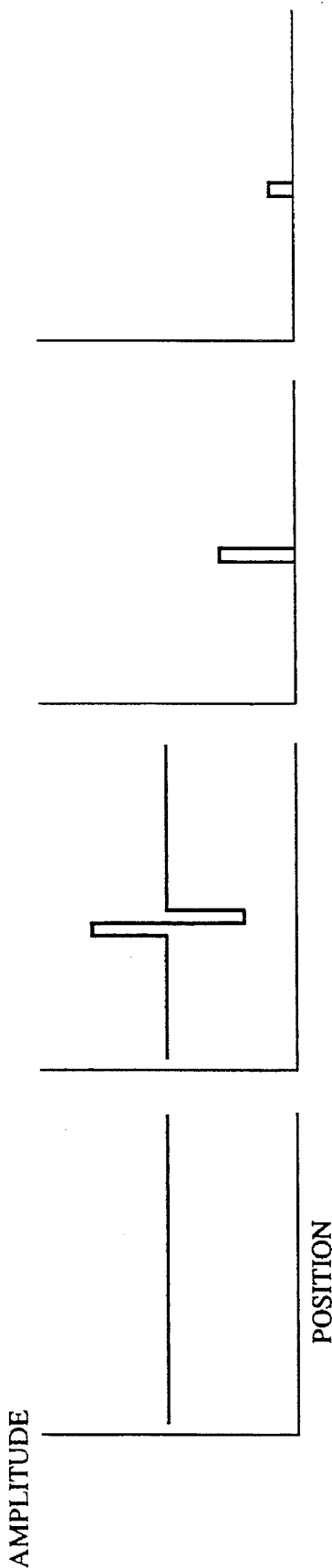
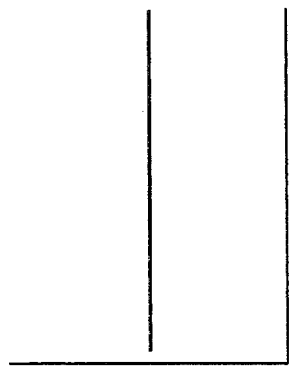
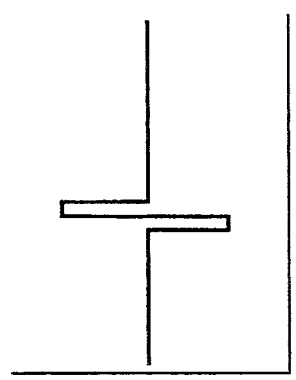
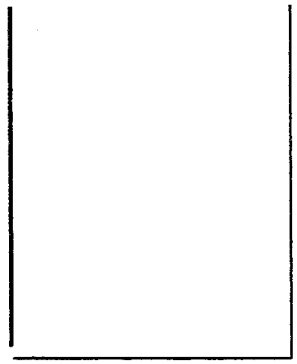
FIG. 14(a) FIG. 14(b) FIG. 14(c) FIG. 14(d)
FIG. 14(e) FIG. 14(f) FIG. 14(g)

IMAGE PROCESSING APPARATUS

BACKGROUND OF THE INVENTION

1. Field of the Invention

The present invention relates to an image processing apparatus such as an electronic camera or the like which is configured so as to electronically record image information, and particularly to an image processing apparatus in a memory control system in which the output data from a solid state image sensor is stored in a DRAM.

2. Description of the Related Art

A conventional electronic camera corresponding to a television system (NTSC or PAL) frequently uses SRAM as memory for storing the data of a solid state image sensor because of high access speed. The SRAM has the disadvantage that a memory capacity which is only enough for one image can be contained in the camera body because of the small capacity and high cost of the SRAM. However, the SRAM has advantages with respect to simple control of writes and reads, rapid access, and a relatively short time required for transferring data because the data capacity handled in the camera is small, as described above. The execution of writes and reads to and from memory and the memory address management accompanying the execution can be controlled directly by a microprocessor, without the need for a special memory control system. However, when a recent HDTV system (High Definition Television) is used, the memory capacity must be increased as the amount of the pixel data for one image is increased, and reads, writes and transfers of the data must be performed at high speed. It is preferable from the viewpoint of a balance of cost and packaging area to use a general purpose DRAM memory for an electronic camera which requires a large amount of data.

However, when DRAM is used as memory, read from a solid state image sensor must be temporarily (refresh cycle) stopped for a refresh operation of the DRAM. The time taken from charge storage in the solid state image sensor to data read therefrom is increased by the stop time, thereby generating much dark current and causing noise spots on the sensor.

The control of the DRAM is also complicated, and the processing speed thereof is lower than that of the SRAM. In addition, the refresh operation is required for holding the stored contents, conditions for address setting and write and read timing are severe, and the access speed is low. A system is thus required for appropriately controlling the DRAM while relating it to the solid state image sensor and other peripheral devices.

A solid state image sensor for color images generally has color filters having a plurality of colors (RGB or YMC) which are bonded to the surface thereof in a mosaic or stripe form so that a color is represented by combination of output of a plurality of pixels corresponding to the filters. If the output of a pixel is saturated, therefore, the color of the periphery of the pixel cannot be correctly reproduced. However, when a general object is photographed, the output of the pixels in a portion or the whole of the image plane of the solid state image sensor are sometimes saturated because the object is excessively bright.

If the output from a pixel is greater than a predetermined value, it is generally decided that the pixel is saturated. In reproduction, the gain (GAIN) of the color of the periphery of the pixel is thus decreased by signal processing for preventing the occurrence of a false color.

However, when the dark current of the solid state image sensor is decreased for decreasing the noise thereof on the basis of the image pickup data of the object, as in a conventional element, since the dark currents of the respective pixels are nonuniform, the level of a pixel which is saturated is decreased due to subtraction. As a result, it is impossible to discriminate an unsaturated pixel and a saturated pixel. There is thus the problem of difficulty in processing for suppressing a false color of a high-brightness portion.

The decrease in dark current also causes the following problem: When general recorded data is reproduced to an image, a high noise component is decreased by passing through a filter. In this case, it is assumed that there is a dark current noise, as shown in FIG. 14(b) below. In FIG. 14, the horizontal position is shown on the abscissa, and the amplitude is shown on the ordinate. In this case, the result of subtraction of the dark current as shown in FIG. 14(b) from original data as shown in FIG. 14(a) is as shown in FIG. 14(c). The resultant data is passed through a filter to produce data as shown in FIG. 14(d). There is thus the problem that the noise cannot completely be removed.

SUMMARY OF THE INVENTION

In consideration of the above problems of conventional apparatuses, it is an object of the present invention to provide an image processing apparatus which can obtain a good image without the remarkable unevenness caused by differences in the storage time of a solid state image sensor.

It is another object of the present invention to provide an image processing apparatus which can simply realize reproduction processing for suppressing the color of a high-brightness portion.

It is a further object of the present invention to provide an image processing apparatus which can effectively utilize a memory capacity.

In order to achieve the objects, in accordance with a first embodiment of the present invention, an image processing apparatus comprises a solid state image sensor for inputting an optical image thereto and converting the input image into an electric signal; image memory comprising a general purpose DRAM formed by at least one chip and having the need for controlling refresh operations from the outside of the memory chip, a timing signal generator for generating a timing signal for reading from the solid state image sensor; transfer/storage control means for horizontally reading data from the solid state image sensor synchronously with the horizontal read timing signal generated from the timing signal generator, transferring the read data to the DRAM and storing the data therein; first refresh signal generation means for refreshing the DRAM at predetermined time intervals when no data is read from the solid state image sensor; and second refresh signal generation means for refreshing the DRAM a predetermined number of times during the dormant period of the horizontal read timing signal. In the apparatus, the second refresh signal generation means is made effective synchronously with the horizontal read timing signal during read from the solid state image sensor, and the first refresh signal generation means is made effective during the time other than the time of read from the solid state image sensor.

In accordance with a second embodiment of the present invention, an image processing apparatus comprises a solid state image sensor for inputting an optical image thereto and converting the image into an electric signal; a storage medium for A/D converting the output data from the solid state image sensor and storing the converted data therein; means for storing the output of the A/D conversion of a first image from the solid state image sensor in a first predetermined region of the storage medium; means for storing the output of the A/D conversion of a second image from the solid state image sensor in a second predetermined region of the storage medium; and operation storage means for adding a first predetermined value to the content of the second storage region of the storage medium, subtracting the content of the first storage region of the storage medium from the result of the addition, and storing the result of the subtraction in the second region of the storage medium. When the output value of the A/D conversion of any desired pixel of the solid state image sensor in which the second image is stored is within a first predetermined range, a second predetermined value is stored in a storage region of the storage medium corresponding to the pixel. When the result value of addition is within a second predetermined range, the result value is replaced by a third predetermined value. When the result value of subtraction is within a third predetermined range, the result value is replaced by a fourth predetermined value.

In accordance with a third embodiment of the present invention, an image processing apparatus comprises a solid state image sensor for inputting an optical image thereto and converting the image into an electric signal; a memory for storing the output data from the solid state image sensor; first, second, third and fourth registers for setting first, second, third and fourth addresses, respectively, for writing data in the memory; first counter means initialized to the contents of the first address; first comparison means for comparing the contents of the first counter means with the contents of the second register; second counter means initialized to the contents of the third address; second comparison means for comparing the contents of the second counter with the contents of the fourth register; address selection means for selecting either of the contents of the first counter and the contents of the second counter to output the selected contents to the memory; and a memory control circuit for controlling the operation of the memory.

In accordance with a fourth embodiment of the present invention, the first address is a start address for writing data in the memory, the second address is an ending address for writing data in the memory, the third address is a start address for reading data from the memory, and the fourth address is an ending address for reading data from the memory, data fetch from the solid state image sensor being stopped on the basis of output from the first or second comparison means.

In accordance with a fifth embodiment of the present invention, an image processing apparatus further comprises second memory means for storing the data contents of the memory; means for continuously accessing any desired region on the memory; and means for transferring in blocks, to the second storage means, the data of any desired region on the memory having a capacity smaller than that of one image plane of the solid state image sensor so as to transfer data from the solid state image sensor to the memory between respective transfer data blocks.

In accordance with the first embodiment, the refresh operation of the DRAM is performed in the dormant period (for example, horizontal blanking period) of the horizontal read signal, whereby reading from the solid state image sensor is not stopped in the course of reading an image.

In accordance with the second embodiment, when the output value of A/D conversion of any desired pixel of the solid state image sensor in which a second image (for example, a dark current pattern) corresponding to a first image (for example, an object image) is within a first predetermined range, a second predetermined value is stored in a storage region on the storage medium corresponding to the pixel, and when the value resulting from addition of the first predetermined value to the contents of the second storage region of the storage medium is within a second predetermined range, the addition result is replaced by a third predetermined value. When the value resulting from subtraction of the contents of the first storage region from the addition result is within in a third predetermined range, the addition result is replaced by a fourth predetermined value. Even if noise enters the dark current image, the noise is thus offset, and a dark current can be subtracted without an adverse effect on an original image.

In accordance with the third to fifth embodiments, an image processing apparatus further comprises a dedicated memory controller provided in a camera, and at least four registers for setting addresses on the memory and various sequencers for writing and reading, which are provided in the controller, whereby the DRAM can appropriately be controlled while being related to the solid state image sensor and other peripheral devices.

BRIEF DESCRIPTION OF THE DRAWINGS

FIGS. 14(a) through 14(g) are drawings illustrating the effects of the second embodiment.

DETAILED DESCRIPTION OF THE PREFERRED EMBODIMENTS

Embodiments of the present invention are described below with reference to the drawings.

Figure 1:
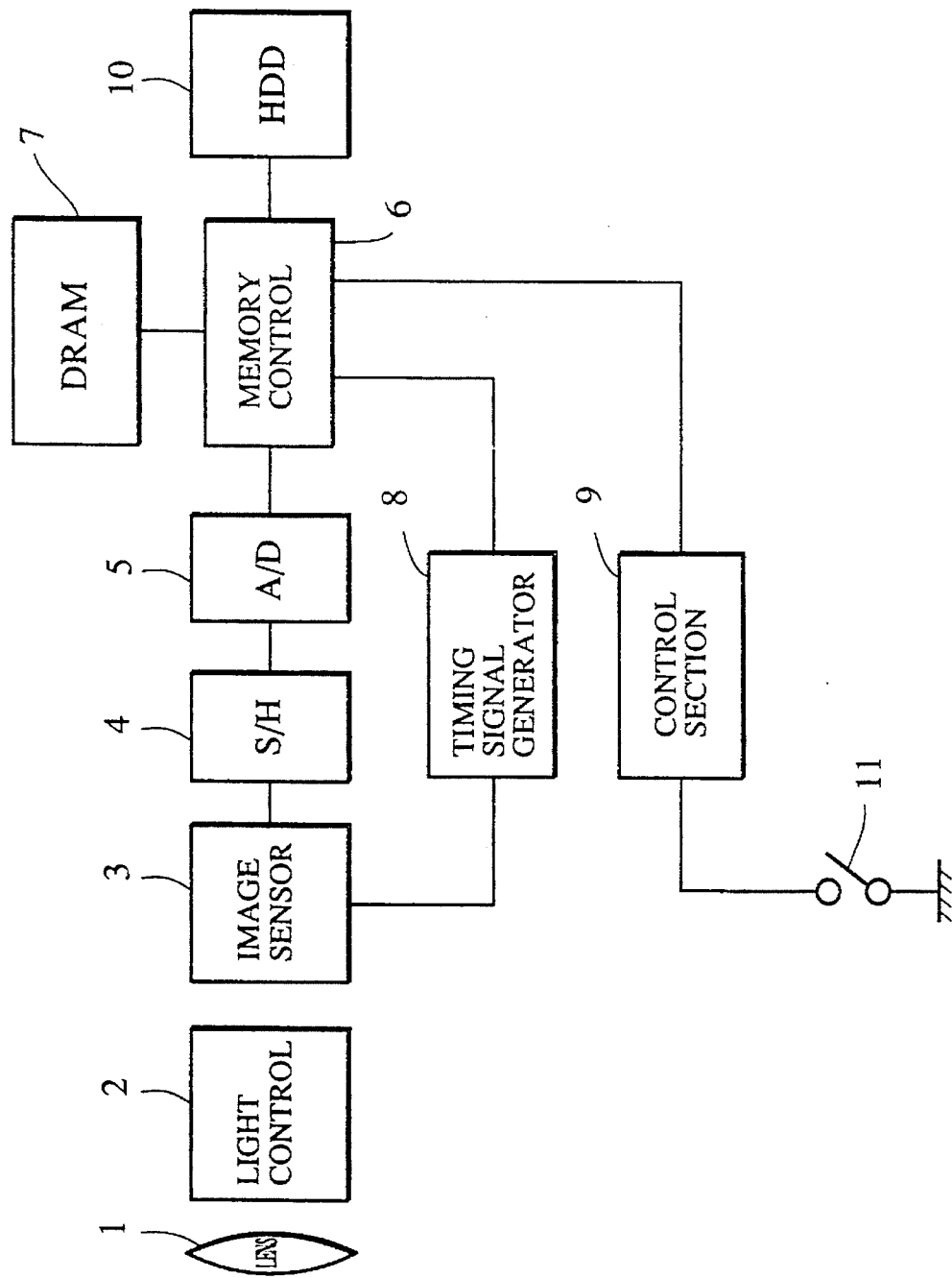
FIG. 1 is a block diagram illustrating an electronic camera in accordance with a first embodiment of the present invention.

FIG. 1 is a block diagram illustrating the configuration of an image processing apparatus (electronic camera) in accordance with a first embodiment of the present invention.

In FIG. 1, reference numeral 1 denotes an image pickup lens; reference numeral 2, a light control member comprising a diaphragm, a shutter and so on; reference numeral 3, a solid state image sensor such as CCD or the like; reference numeral 4, a sample-and-hold circuit for sampling and holding the output from the solid state image sensor 3; reference numeral 5, an A/D converter; reference numeral 6, a memory controller for controlling the refresh operation of DRAM, write and read; reference numeral 7, the DRAM; reference numeral 8, a timing signal generator for generating a timing signal and a sample-and-hold pulse for driving the solid state image sensor 3, and an A/D conversion pulse; reference numeral 9, a control section for controlling a system for an image pickup sequence; reference numeral 10, a storage medium such as a hard disk; and reference numeral 11, a trigger switch.

A description will now be made of a flow of image data accompanying photography by a camera.

An object image passed through the image pickup lens 1 is projected on the solid state image sensor 3. At this time, the control section 9 controls the light control member 2 so that exposure is performed appropriately.

The image data stored in the solid state image sensor 3 is successively read synchronously with the timing signal generated from the timing signal generator 8. The data is then sampled and held by the sample-and-hold circuit 4, and converted to a digital value by the A/D converter 5. The A/D converted data is stored in the DRAM 7 under control by the memory controller 6. The image data stored in the DRAM 7 is read with predetermined timing by the control section 9, and is transferred to the hard disk 10 to bring the data flow to an end.

The storage of the A/D converted data in the DRAM 7 under control by the memory controller 6 in accordance with the present invention is described in detail below.

Figure 2:
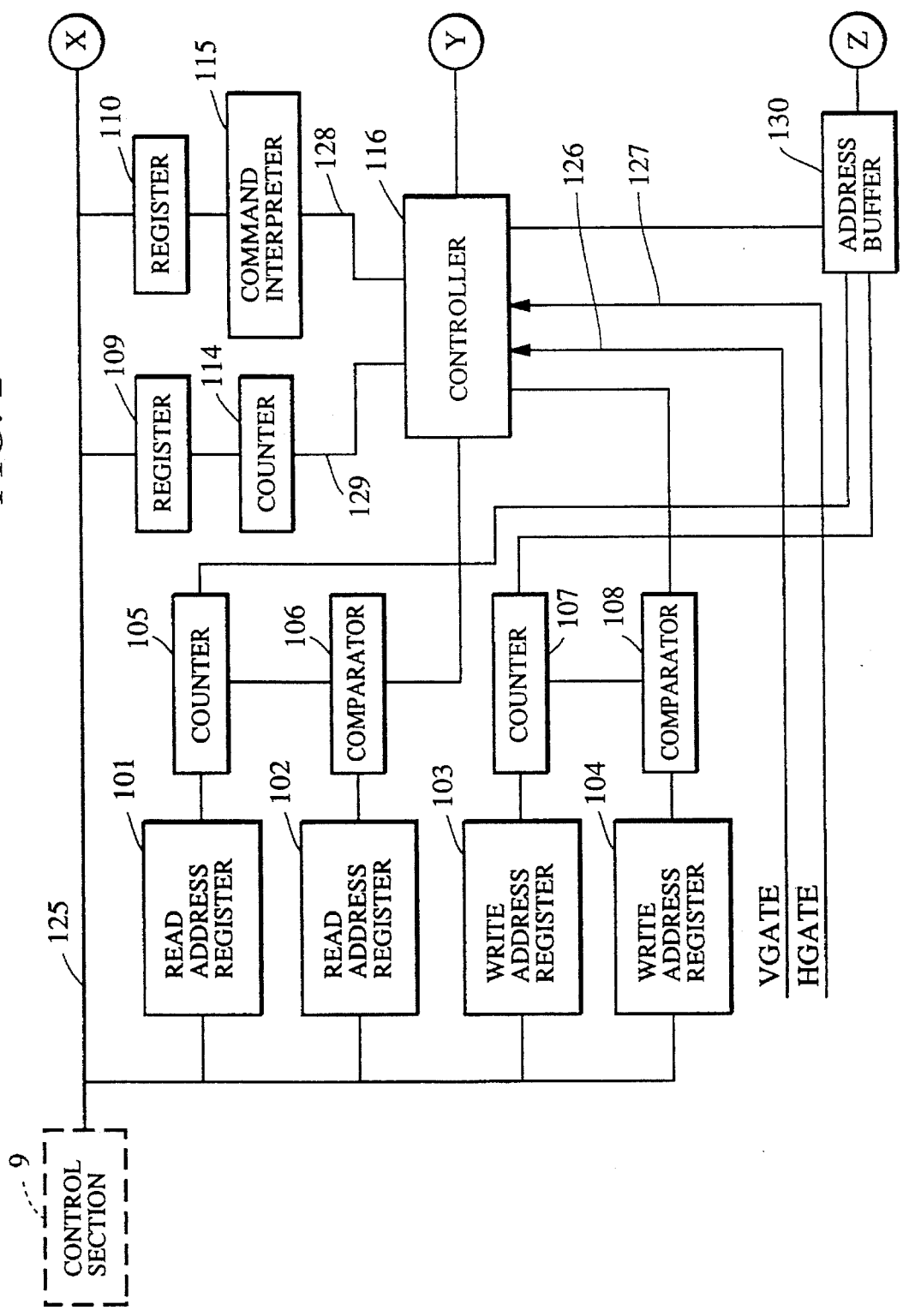
FIG. 2 is a block diagram illustrating the memory controller shown in FIG. 1.
Figure 3:
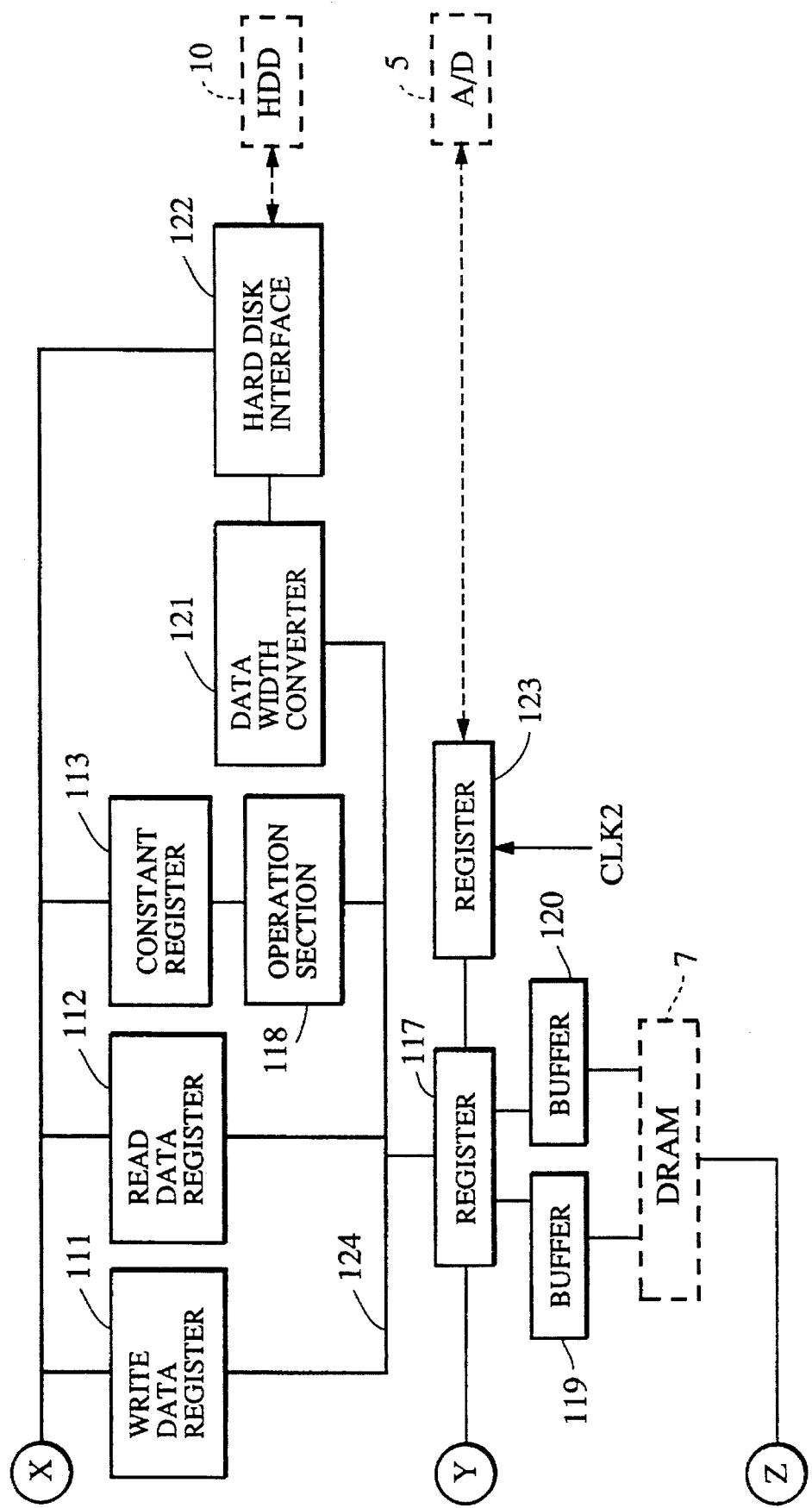
FIG. 3 is a block diagram continued from FIG. 2.

FIGS. 2 and 3 are block diagrams of the memory controller 6 shown in FIG. 1.

In FIGS. 2 and 3, reference numeral 125 denotes a system bus which is connected to the control section 9 shown in FIG. 1 so that a command and data are transmitted between the control section 9 and the memory controller 6 through the system bus 125. In the drawings, reference numerals 101, 102, 103 and 104 respectively denote DRAM address registers for specifying addresses in the DRAM. The address registers 101 and 102 set READ addresses for reading data from the DRAM, and the address registers 103 and 104 set WRITE addresses for writing data to the DRAM.

The address registers 101 and 103 set the start addresses which will be described below, and the address registers 102 and 104 set the ending addresses.

Reference numerals 105 and 107 each denote a counter for updating an address for accessing the DRAM, and reference numerals 106 and 108 each denote a comparator for making comparison and decision whether or not the present access address reaches the ending address. Reference numeral 109 denotes a register for setting a DRAM refresh cycle; reference numeral 114, a refresh counter for counting the refresh cycle; reference numeral 110, a register for receiving a command given from the control section 9 to the memory controller 6; reference numeral 115, a command interpreter for interpreting the kind of the command; reference numeral 111, a WRITE data register for holding write data when any desired data is written in the DRAM; reference numeral 112, a READ data register for transferring the data read from the DRAM to the control section 9; reference numeral 113, a constant register for storing correction constant data for correcting the data stored in the DRAM; reference numeral 117, a register or buffer for storing data to be written to or read from the DRAM; reference numeral 118, an operation section for computing a correction value; reference numeral 119, a buffer for inputting data read from the DRAM thereto; reference numeral 120, a buffer for writing data to the DRAM; reference numeral 121, a data width converter for rearranging the data (40 bits) from the DRAM to the bus width (16 bits) of a hard disk interface; reference numeral 122, the hard disk interface for transmitting data and commands to the hard disk 10; and reference numeral 123, an A/D data register for holding the data output from the A/D converter and timing with the inside of the memory controller 6, which register is latched with clock CLK2. Although not shown in FIGS. 2 and 3, the whole memory controller 6 is operated with timing with clock CLK1. Reference numeral 124 denotes a data bus having a 40 bit width for reading and writing data from and in the DRAM. Reference numeral 116 denotes a controller for controlling the execution timing of the command received by the controller in the memory controller 6 from the outside and data transfer. Reference numerals 126 and 127 each denote a trigger signal for reading data from the A/D converter 5. The trigger signal 126 is a signal for specifying the start timing of vertical read from the solid state image sensor 3, which is referred to as "VGATE" hereinafter. The trigger signal 127 is a signal for specifying the start timing of horizontal read, which is referred to as "HGATE" hereinafter. Reference numeral 128 denotes a line group output from the command interpreter 115.

Reference numeral 129 denotes a refresh request signal output from the refresh counter 114. Reference numeral 130 denotes a DRAM address buffer for outputting the contents of the counter 105 or 107 to the DRAM on the basis of a selection signal output from the controller 116.

A description will now be made of the operation of storing data from the solid state image sensor to the DRAM in this embodiment configured as described above.

The addresses of writes to the DRAM are previously set in the address registers 103 and 104 shown in FIG. 2. The command (referred to as "PAGE WR MODE" hereinafter) to read from the solid state image sensor is written in the command register 110. The timing signal generator 8 shown in FIG. 1 generates the signals VGATE and HGATE synchronously with the read from the solid state image sensor. This is described below with reference to FIGS. 4 and 5.

Figure 4:
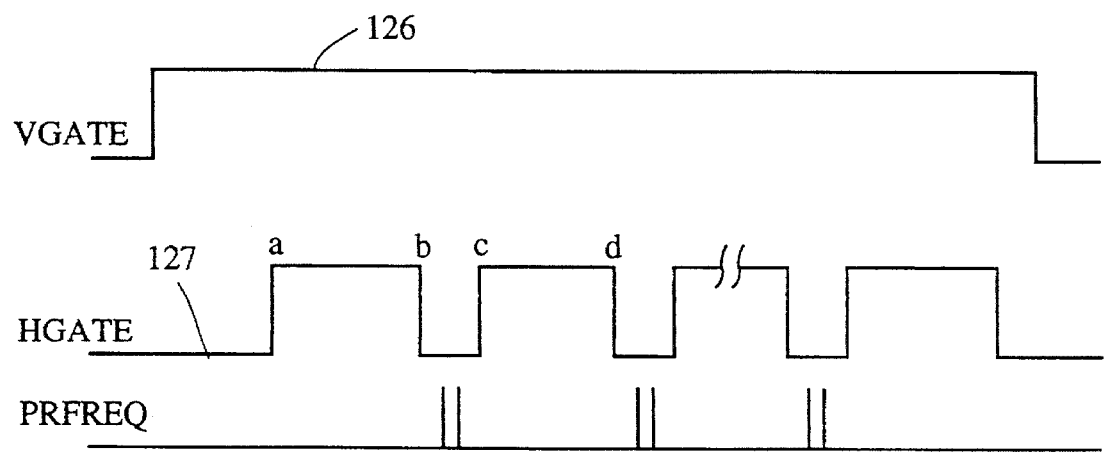
FIG. 4 is a drawing illustrating data read from a solid state image sensor.
Figure 5:
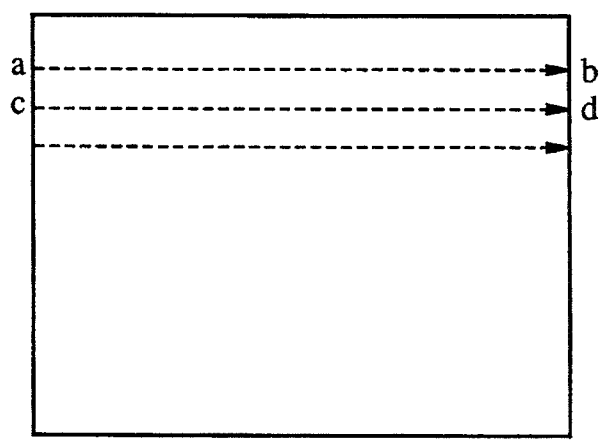
FIG. 5 is another drawing illustrating data read from the solid state image sensor.

FIG. 4 is a conceptual drawing of timing of the above-described signals VGATE and HGATE.

In FIG. 4, when the signal VGATE is at a HIGH level, data is read from the solid state image sensor. When the signal HGATE is at a LOW level, data read is stopped. Data for predetermined horizontal lines is read from the solid state image sensor during the time from rising of the signal HGATE from the LOW level to the HIGH level to fall to the LOW level. This is described with reference to FIG. 5. The portion ab of the signal HGATE shown in FIG. 4 corresponds to the portion ab shown in FIG. 5. Likewise, the portion cd of the signal HGATE shown in FIG. 4 corresponds to the portion cd shown in FIG. 5. The refresh operation of the DRAM in accordance with the present invention is performed when the signal HGATE is LOW.

The refresh timing control is described below with reference to FIG. 6.

Figure 6:
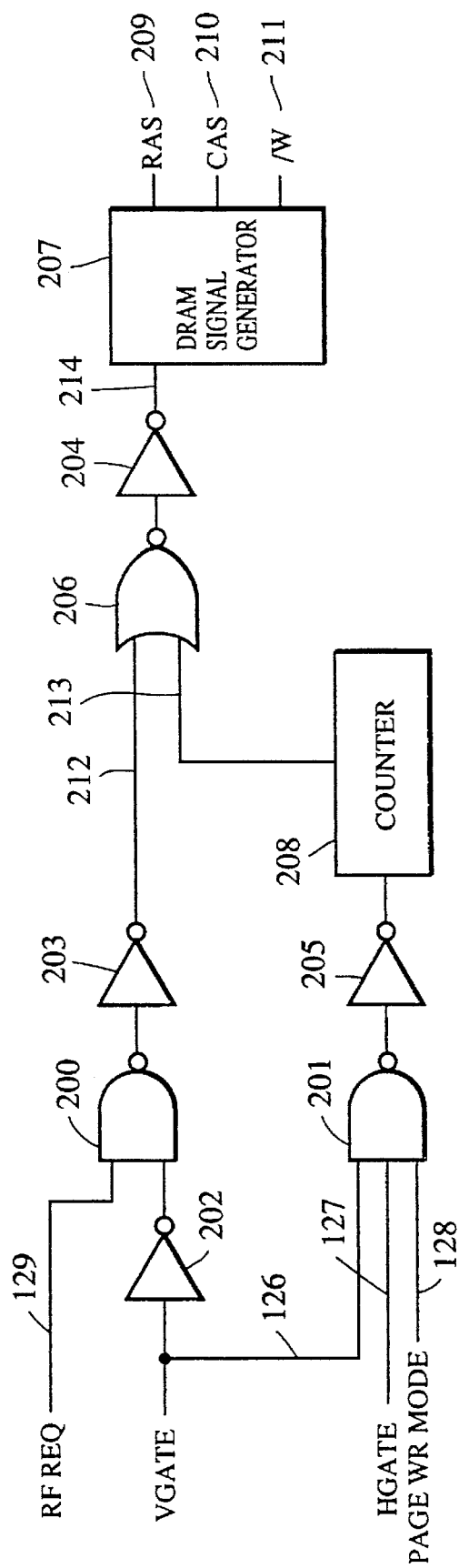
FIG. 6 is a drawing illustrating a circuit related to refresh timing control.

FIG. 6 shows a circuit contained in the controller 116 shown in FIG. 2. However, FIG. 6 shows only the timing control section for the refresh operation which is directly related to the present invention, not the whole controller 116. Reference numeral 128 denotes one of the output signals from the command interpreter 115 shown in FIG. 2. The signal 128 indicates a mode for writing data read from the solid state image sensor to the DRAM and which is referred to as "PAGE WR MODE" (Page Write Mode) hereinafter.

Reference numerals 200 and 201 each denotes a NAND gate; and reference numerals 202, 203, 204 and 205 each denotes a INVERTER gate. Reference numeral 206 denotes a NOR gate; reference numeral 207, a DRAM signal generator for generating, to the DRAM, various signals such as RAS 209, CAS 210, /W 211 etc; reference numeral 208, a refresh request signal generation counter for generating a refresh request signal in the PAGE WR MODE; reference numeral 209, a row address strobe for the DRAM; reference numeral 210, a column address strobe for the DRAM; reference numeral 211, a write strobe; reference numeral 212, a refresh request signal in a normal state; reference numeral 213, a refresh request signal in the PAGE WR MODE; and reference numeral 214, a refresh execution signal.

The operation of the circuit shown in FIG. 6 is described below.

When no data is read from the solid state image sensor, both signals VGATE and HGATE are at the LOW level, as described above. At this time, the refresh request signal is periodically brought into the HIGH level by the refresh counter 114 shown in FIG. 2. The NAND gate 200 thus periodically outputs the signal Low, and the refresh execution signal is periodically input to the DRAM signal generator 207 through the NOR gate 206. The DRAM signal generator 207 consequently generates the refresh signal.

The refresh operation may be performed by, for example, the CAS BEFORE RAS method.

The DRAM signal generator 207 is a sequencer which is designed so as to output the CAS BEFORE RAS signal once when receiving the refresh execution signal 214.

Data read from the solid state image sensor is described below. When data is read from the solid state image sensor, both signals VGATE and HGATE are as shown in FIG. 4, as described above. Since the signal VGATE becomes the HIGH level, the normal refresh request signal (SREREQ 212) is not generated because the RFREQ signal 129 is inhibited by the NAND gate 200.

On the other hand, the gate 201 becomes the LOW level during the time the signal HGATE is the LOW level (during the period bc shown in FIG. 4). The refresh request signal generation counter 208 for the PAGE WR MODE generates the refresh request signal a predetermined number of times, as shown by PRFREQ in FIG. 4. In FIG. 4, the refresh request signal is generated two times during the time the signal HGATE is at the LOW level). In this way, when data is read from the solid state image sensor, the refresh operation is executed during the time the signal HGATE is the LOW level.

Although, in the first embodiment, the number of refresh operations is two during the time the signal HGATE is the LOW level, the number of refresh operations depends upon the kind of the DRAM, the number of element lines possessed by the solid state image sensor, and the time required for reading data from the elements.

For example, when the refresh operation is performed with refresh cycles of 4096 cycles/64 milliseconds, i.e., 4096/64=6400 (cycle/sec), by the CAS BEFORE RAS method according to the specifications of the DRAM, and when the solid state image sensor has 1024×1024 pixels and requires 100 micro seconds for reading data for one row, since the minimum cycles for read of one row (100 micro seconds) are 6.4 cycles, at least 7 cycles of refresh operations may be performed. The horizontal read ending period is of course set to a time sufficient to perform at least 7 refresh operations. Although write in the DRAM is not described above, the write in the DRAM may be performed in the high-speed page mode.

The number of refresh cycles may be changed so as to cope with other types of DRAM and solid state image sensors. Since the usual refresh cycles may be changed by changing the count period of the counter 114 shown in FIG. 2, desired cycle data may be written in the refresh cycle register 109.

Similarly, when data is read from the solid state image sensor, the counter 208 shown in FIG. 6 may be set to a value PRESETABLE. As a result, since the PRFREQ (refresh request signal) is output any desired number of times, the number of refresh operations during the time the signal HGATE is the LOW level can be changed. Although, in the above description, it is assumed for the sake of simplification that data is read, line by line, from the solid state image sensor, data for several lines may be read at a time. In this case, the solid state image sensor may have a plurality of output terminals, and a change-over switch may be provided in front of a single A/D converter. Alternatively, data from the plurality of output terminals may be written in the memory as it was. All of these cases, of course, are within the scope of the present invention.

An image processing apparatus in accordance with a second embodiment of the present invention is described below.

Figure 7:
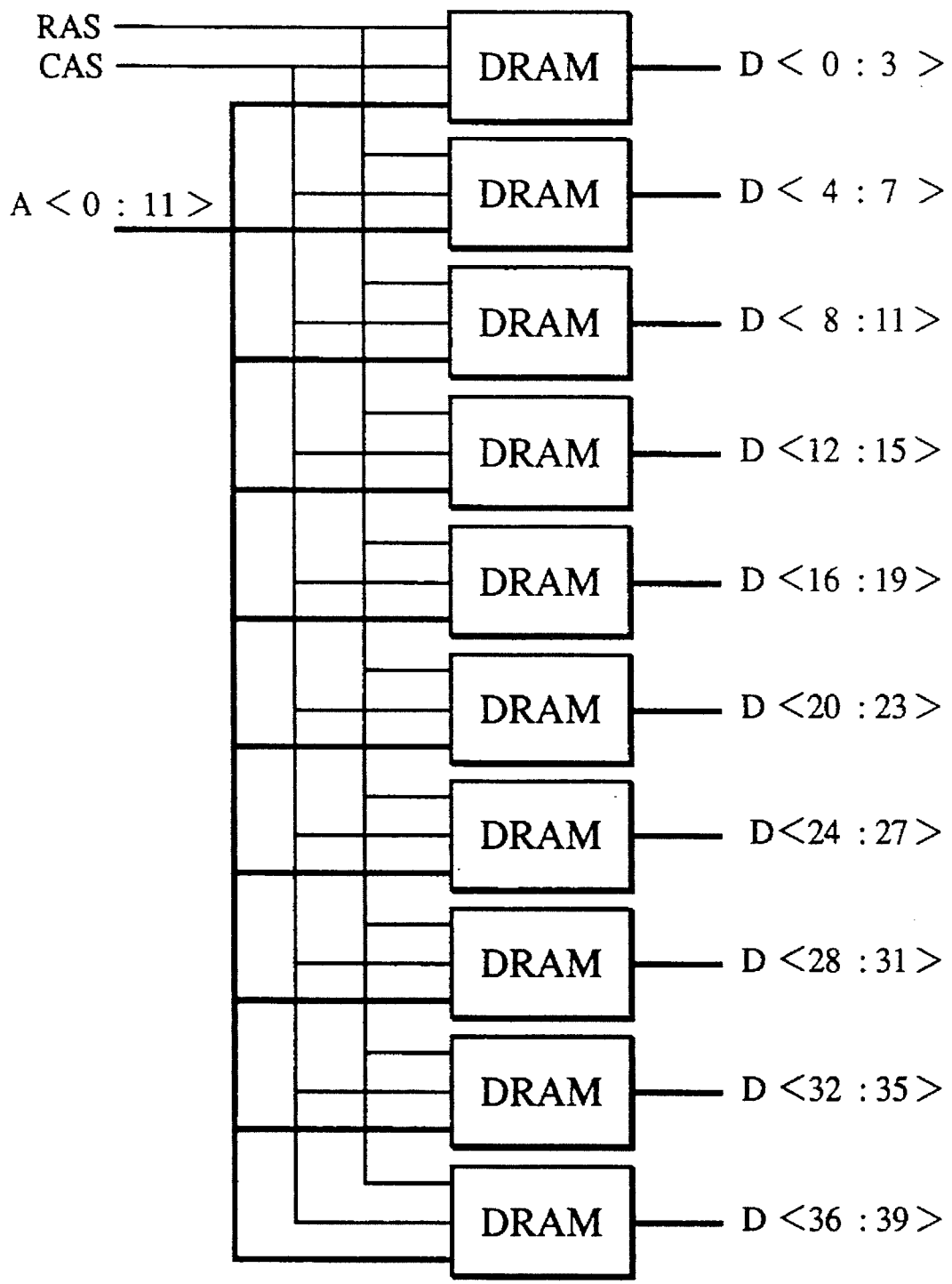
FIG. 7 is a drawing illustrating the configuration of a DRAM of an electronic camera in accordance with a second embodiment of the present invention.

Although the second embodiment has the same configuration as that of the first embodiment, shown in FIGS. 1 and 2, it is assumed that the DRAM has the configuration shown in FIG. 7.

Namely, the address bus, the signals RAS and CAS and other signals/W and/OE, both of which are not shown in the drawing, are connected to each of 10 DRAM chips of 16 MBit with the X4 structure.

Data is connected to each of the chips, and is written therein at a time through a 40-bit data bus.

The addresses stored in the DRAM are described below.

The addresses for writing in the DRAM are previously set.

Figure 8:
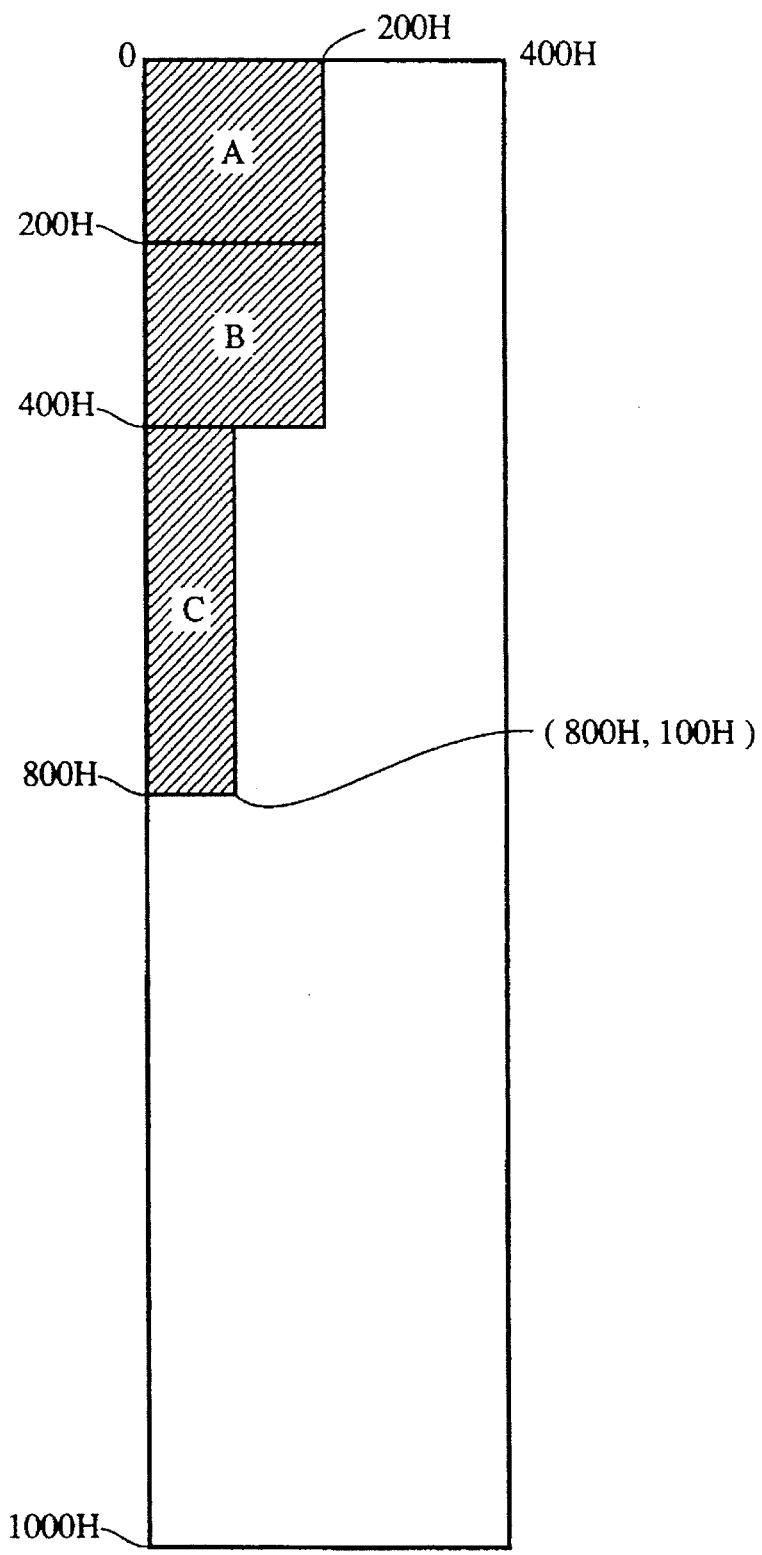
FIG. 8 is a drawing illustrating the address space of the DRAM in the second embodiment.

As shown in FIG. 8, a 16-M word address space (1 word=10 bits) comprising ROW addresses 00H to 1000H and CAS addresses 00H to 400H.

The image data for one image plane is stored in the region A shown in FIG. 8.

It is thus assumed that the ROW address thus ranges from 00H to 200H, and CAS address ranges from 00H to 200H.

The addresses are set in the address registers 103 and 104 shown in FIG. 2. If it is desired to further read an image, addressing is made within a region which is not superposed on the region A shown in FIG. 8, for example, the region B shown in FIG. 8. The read data may be exposed and then transferred to the DRAM. In this embodiment, the object image and the dark current are stored in the regions A and B, respectively.

Data read from the solid state image sensor is the same as that in the first embodiment. The refresh operation of the DRAM is also controlled to be made during the time the signal HGATE is at the LOW level in the same way as in the first embodiment.

The operation of storing data in the DRAM is described below.

The data read from the solid state image sensor is quantized with 10 bits per pixel. Thus, the A/D converter 5 also has two channels each having 10 bits.

The operation is described below with reference to FIG. 9.

Data is output from the solid state image sensor pixel by pixel for each of the channels at the same transfer speed as that of clock CLK2 302. However, the phase need not be the same as that of the clock CLK2. In FIG. 9, reference numeral 300 denotes the A/D output of one of the two channels, and reference numeral 301 denotes the A/D output of the other channel.

Figure 9:
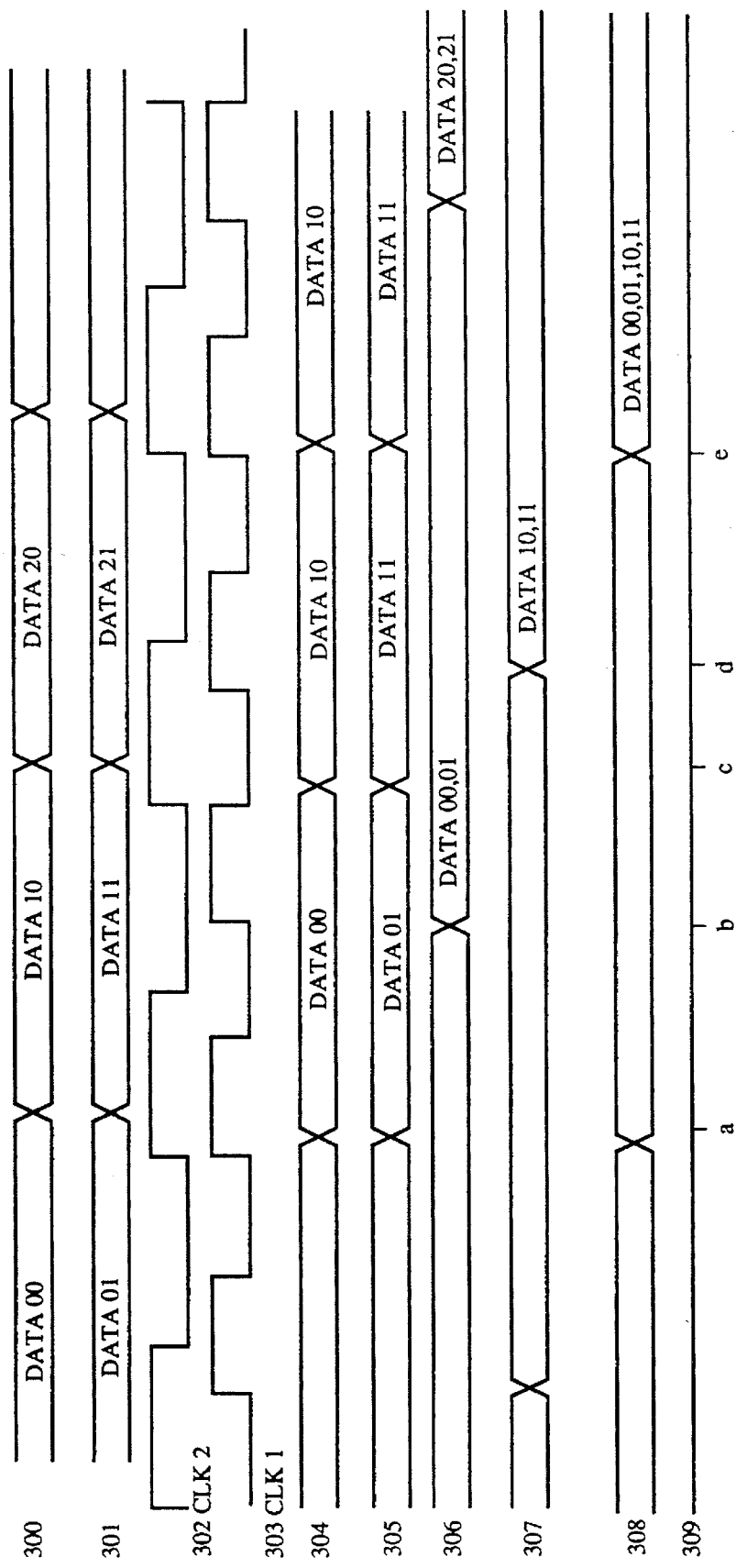
FIG. 9 is a drawing illustrating the operation timing stored in the DRAM.

The data is successively latched by the A/D register 123 synchronously with the clock timing of the clock CLK2 302, as shown by DATA 00 (304) and DATA 01 (305), DATA 10 and DATA 11, DATA 20 and DATA 21, etc. in FIG. 9.

The data 304 of the A/D register 123 is further latched by the RAM buffer 117 with timing shown by b in signal 309 synchronously with the clock CLK1 303 to output data 306. On the other hand, the data 305 of the A/D register 123 is latched by the RAM buffer 117 with timing shown by d in the signal 309 synchronously with the clock CLK1 303 to output data 307. In this embodiment, the RAM buffer 117 can latch data of 40 bits.

Data for four pixels (40 bits) is thus stored in the RAM buffer 117. The data is transferred to the output buffer 120 with the timing shown by e in the signal 309, and then written to the DRAM. At this time, the contents of the address counter 107 are updated under control by the controller 116 shown in FIG. 2, and the address for write on the DRAM is also updated.

When the value of the address counter 107 agrees with the content of the address end register, an agreement signal is transmitted from the comparator 108 to the controller 116, and the mode of write in the DRAM is terminated.

If it is desired to further read an image, addressing is made within a region which is not superposed on the region A shown in FIG. 8, for example, the region B, and the read data may be exposed and then transferred to the DRAM.

The data stored in the DRAM by the above method is transferred to the storage medium such as the hard disk or the like. Although this data transfer is described below, it is briefly described because it is not related directly to the present invention.

In this case, since data is read from the DRAM, the read start address is set in the register 101, and the read ending address is set in the register 102.

Only the region A in which data was previously stored may be specified for transferring data of only one image, or both regions A and B may be specified for transferring data for two images at one time.

When data of both regions A and B are transferred, ROW address 00H and CAS address 00H are set in the register 101, and ROW address 400H and CAS address 200H are set in the register 102. The mode for transferring data to the hard disk may be set in the command register 110.

Since the hard disk is generally a 16-bit data bus (AT-BUS interface), the width of the data read from the DRAM is converted by the bit width converter 121. In the bit width converter 121, the data of the RAM buffer 117 which is read twice from the DRAM for 40 bits at a time is stored to 80 bits, and is divided into five 16-bit portions and output to the hard disk interface HDD I/F 122. At the same time, the value of the address counter 105 is continuously updated.

The above operation is repeated until the content of the address counter agrees with the value of the register 102. When the content of the address counter 105 agrees with the value of the register 102, the signal output from the comparator 106 is transmitted to the controller 116, and the mode for writing data to the hard disk is terminated.

The operation of the second embodiment is described below with reference to the flowcharts shown in FIGS. 10 and 11.

An image pickup trigger is checked by the switch 11 shown in FIG. 1 in Step S1.

If the switch 11 is pressed (turned on), the memory is examined in Step S2 for a space capacity sufficient for one image plane.

If there is a space capacity, the address region (for example, the region A shown in FIG. 8) of data for one image plane is set in Step S3. Image pickup (charge is stored in the solid state image sensor by controlling the shutter and the diaphragm) is performed in Step S4. The data of the solid state image sensor is transferred to the memory in Step S5. The "image pickup ending flag" is set in Step S6 for temporarily storing that the object image is recorded.

The flow then returns to Step S1. If the image pickup is not triggered, the image pickup ending flag is checked in Step S7. If the image pickup ending flag is set, dark current recording and subtraction processing are performed in Steps 8 to 12. In Step S8, the image pickup ending flag which is set in Step S6 is cleared. A new address is set in a region (for example the region B shown in FIG. 8) which is not superposed on the previous image pickup data in Step S9. Charge is stored in the solid state image sensor while the shutter is closed in Step S10, and the stored data is transferred to the memory in Step S11. The dark current data is subtracted from the object image data in Step S12. The result of subtraction is again stored in the memory. This will be described in further detail below.

It is checked in Step S13 whether of not untransferred data remains. If the untransferred data remains, addresses for data having a predetermined capacity are set in Step S14 (set to an intermediate point of the region A shown in FIG. 8, for example RAS address 100H and CAS address 200H). A predetermined amount of data is transferred from the memory to the hard disk in Step S8, and the flow then returns to Step S1. If the image pickup trigger is turned off, the flow moves to Step S7.

Since, in Step S7, the image pickup ending flag is cleared in Step S8, the flow moves to Step S13. Since all data is not completely transferred in Step S13, addresses are continued from the address (RAS address 101H and CAS address 00H) of the portion from which data was previously transferred in Step S14. The data is transferred to the hard disk in Step S15, and the flow returns to Step S1. When the data is completely transferred through Steps S1, S7, S13, S14 and S15, record of one image is completed.

The flowchart of the case where the result different from that described above is obtained by decision in each of the decision steps (Steps S1, S2, S7 and S13) is not described below for the sake of simplification.

Figure 10:
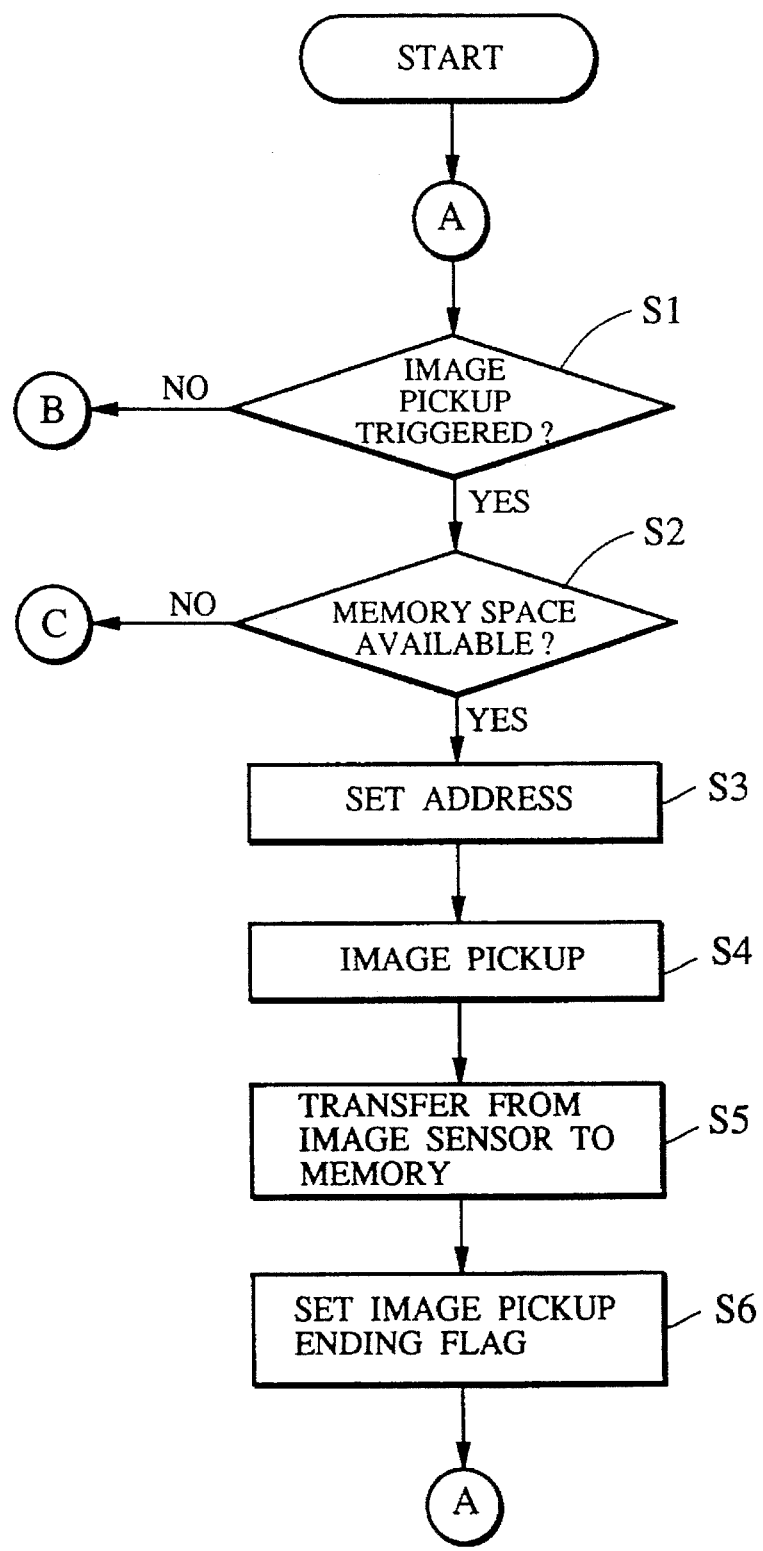
FIG. 10 is a flowchart illustrating the operation of the second embodiment of the present invention.
Figure 11:
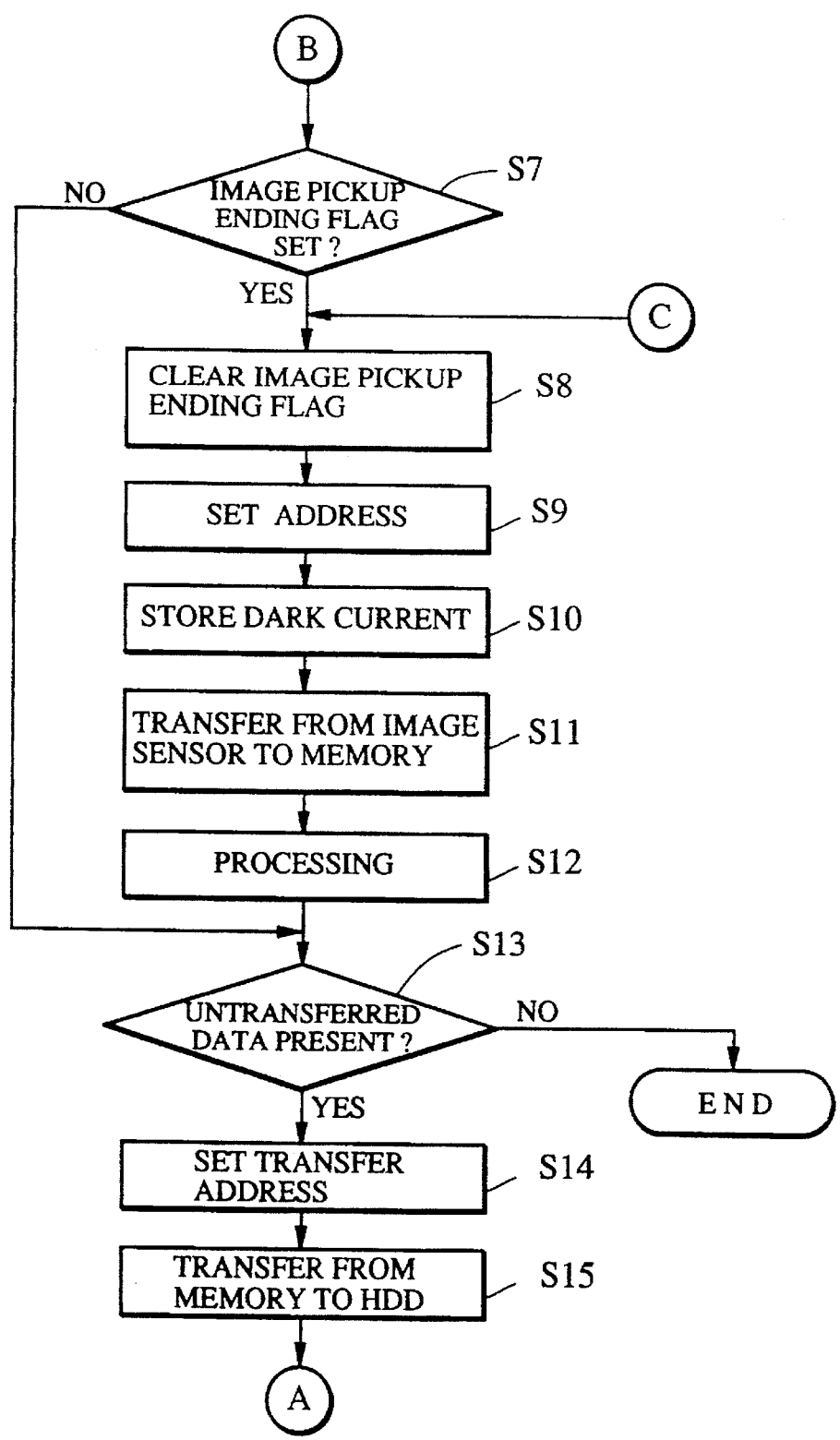
FIG. 11 is a flowchart continued from FIG. 10.

As described above, the operation can be performed by the control section 9 in accordance with the sequence shown by the flowcharts of FIGS. 10 and 11 so that the object image is pickup and stored in the memory, and the result of subtraction of the dark current from the object image is transferred to the hard disk.

Figure 12:
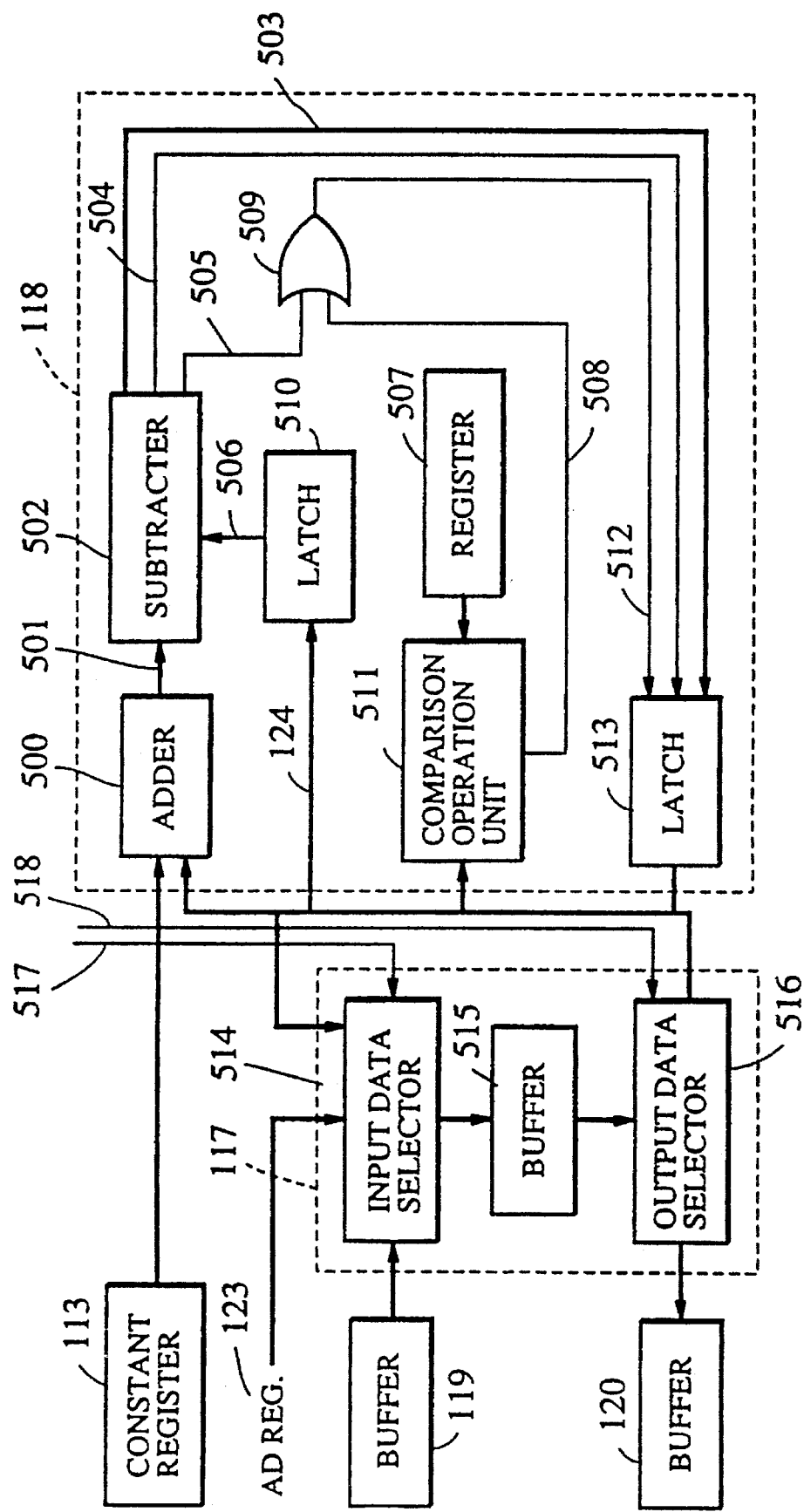
FIG. 12 is a block diagram illustrating details of the register 117, an operation section 118 and the peripheral portion thereof shown in FIG. 3.

The processing in Step S12 shown in FIG. 11 is described in detail below. FIG. 12 is a block diagram illustrating details of the register 117, the operation section 118 and the peripheral portion thereof, which are shown in FIG. 3. In FIG. 12, a section 117 shown by a broken line corresponds to the register 117 shown in FIG. 3, and a section 118 shown by a broken line corresponds to the operation section 118. Portions 113, 119, 120 and 123 also correspond to the portions denoted by the same reference numerals in FIG. 3. Reference numeral 515 denotes a buffer, and reference numeral 514 denotes an input data selector for the buffer 515 which selects any one of the A/D register output 123, the output of the input buffer 119 from the DRAM and the RAM bus data 124 and outputs the selected data to the buffer 515. Reference numeral 516 denotes a selector of output data from the buffer 515, which selector outputs the output data from the buffer 515 to one of buffer 120 and the RAM bus 124. Reference numeral 517 denotes a selection signal for selecting input of the data selector 514, which signal is controlled by the controller 116 shown in FIG. 2.

Reference numeral 518 denotes a selection signal for selecting the output from the data selector 516, which signal is controlled by the controller 116. Reference numeral 500 denotes an adder for adding data of the constant register 113 to data of the RAM bus 124 to output the result to the data bus 501. Reference numeral 510 denotes a latch for holding the contents of the RAM bus 124; reference numeral 506, an output bus for the latch 510; and reference numeral 502, a subtracter for computing a difference between the addition result 501 and the latch 510 to output the computation result to the bus 503. Reference numeral 504 denotes a minus flag signal which is made the HIGH level when the results of addition and subtraction are negative; reference numeral 505, an OVERFLOW flag signal which is made the HIGH level when the results of addition and subtraction overflow; reference numeral 507, a register for holding a predetermined value; reference numeral 511, a comparison computer for comparing the data of the RAM bus with the data held of the register 507, and making the BRIGHT signal 508 the HIGH level if the data of the RAM bus is greater than the predetermined value.

Reference numeral 509 denotes an OR gate; reference numeral 512, OR gate output; and reference numeral 513, a latch for holding the results of addition and subtraction. The content of the latch 513 is set to a predetermined value (for example, 3 FF [HEX]) when the OR gate output is the HIGH level, and is cleared to zero when the minus flag 504 is the HIGH level.

Figure 13:
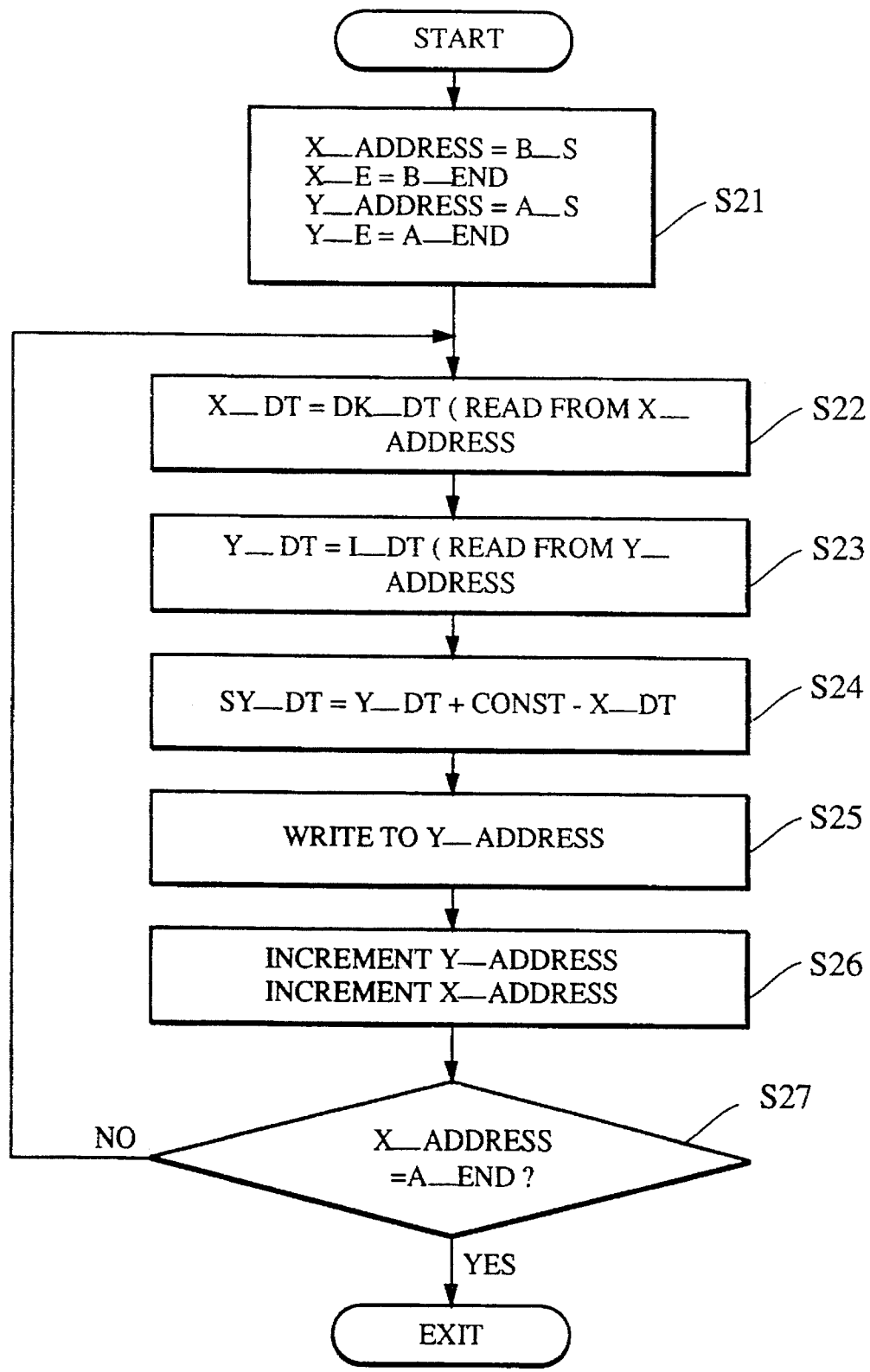
FIG. 13 is a flowchart illustrating the processing operation of the second embodiment.

FIG. 13 is a flowchart showing the processing operation. The operation below is mainly performed by the controller 116 shown in FIG. 2.

The memory address regions in which original data and dark current data are stored are set in Step S21. The storage addresses of the dark current data, i.e., the start address and the end address of the region B shown in FIG. 8, are set in X_ADDRESS and X_E, respectively. Referring to FIG. 2, the start address is set to B_S in register 101 (XS), and the end address is set to B_END in register 102 (XE).

The storage addresses of the original data, i.e., the start address and the end address of the region A shown in FIG. 8, are set in Y_ADDRESS and Y_E, respectively. Referring to FIG. 2, the start address is set to A_S in register (YS), and the end address is set to A_END in register 104 (YE).

The dark current data is read from the X-ADDRESS in Step S22 (DK_DT), and is held as X_DT by the latch 510 shown in FIG. 12. At this time, the selection signals 517 and 518 shown in FIG. 12 are controlled by the controller 116 shown in FIG. 2 so that the selector 514 selects the input buffer 119, and the selector 516 selects the RAM bus 124.

The original data is read from Y_ADDRESS in Step S23 (I_DT) and then output to the RAM bus 124. The constant held by the register 113 is added to the original data (I_DT) on the RAM bus 124 by the adder 500 in Step S24, and the addition result is output to the bus 501. The dark current data (DK_DT) of the latch 510 is subtracted from the data of the bus 501 by the subtracter 502, and the subtraction result is output to the bus 503. The operation result is held by the latch 513. At this time, if the operation result is zero or less, the minus flag becomes the HIGH level, and the latch 513 is cleared to zero.

If the operation result overflows, and the OVERFLOW flag is the High level, or if the original data is greater than a predetermined value, and the BRIGHT signal 508 is the HIGH level, the output 512 of the OR gate 509 become the HIGH level, and the latch 513 is set to a predetermined value (3 FF).

The selection signals 517 and 518 shown in FIG. 12 are controlled by the controller 116 shown in FIG. 2 so that the selector 514 selects the RAM bus 124, and the selector 516 selects the output buffer 120 in Step S25. The data of the latch 513 is rewritten in the Y_ADDRESS on the memory. Namely, the original data of the Y_ADDRESS on the memory is rewritten by the data obtained by subtraction of the dark current from the original data.

The values of the original data address (Y_ADDRESS) and the dark current address (X_ADDRESS) are incremented for processing the data at the next address on the memory in Step S26. If the incremented address values are different from the end address (A_END) of the region A shown in FIG. 8 in Step S27, the flow returns to Step S22 in which the data of the updated address is processed by the same method as that described above. If X_ADDRESS is not equal to A_END in Step S27, it is decided that operation is completed for the all pixels of one image plane.

The above operation is applied to the case where noise enters the dark current image, as shown in FIGS. 14(a)–(g). Since a predetermined value is first added to the original data of FIG. 14(a), the original data FIG. 14(a) is offset as shown by FIG. 14(e). If noise as shown by FIG. 14(b) is subtracted from the data shown in FIG. 14(e), data as shown in FIG. 14(f) is obtained. After the data shown by FIG. 14(f) is passed through a low pass filter, the noise is offset to leave the original data shown by FIG. 14(g). Although, in the above embodiment, the data obtained by subtracting the dark current data is rewritten in the memory region where the original data is previously stored, the data may be written in another region. In this case, additional address registers ZS and ZE may be provided in addition to the address registers XS, XE, YS and YE respectively shown by reference numerals 101 to 104 in FIG. 2. The start and end addresses of an address region in which the data after subtraction is stored may be set in the registers ZS and ZE. Accordingly, a pair of steps for addressing and updating may be added to the operation shown in FIG. 13.

Although, in the above embodiments, the pixel data of the solid state image sensor is quantized with 10 bits, the number of bits may be set to any desired value and an optimum value for the system. In this case, the data bus width of each of the sections may be changed, and the gist of the present invention can be realized, as in the above embodiments. In addition, the dark current may be stored in the memory before the object image is photographed. In the case of a continuous pickup mode, the dark current may be stored after continuous image pickup. In any case, the dark current may be stored with optimum timing for the system.

A third embodiment of the present invention is described below.

Figure 15:
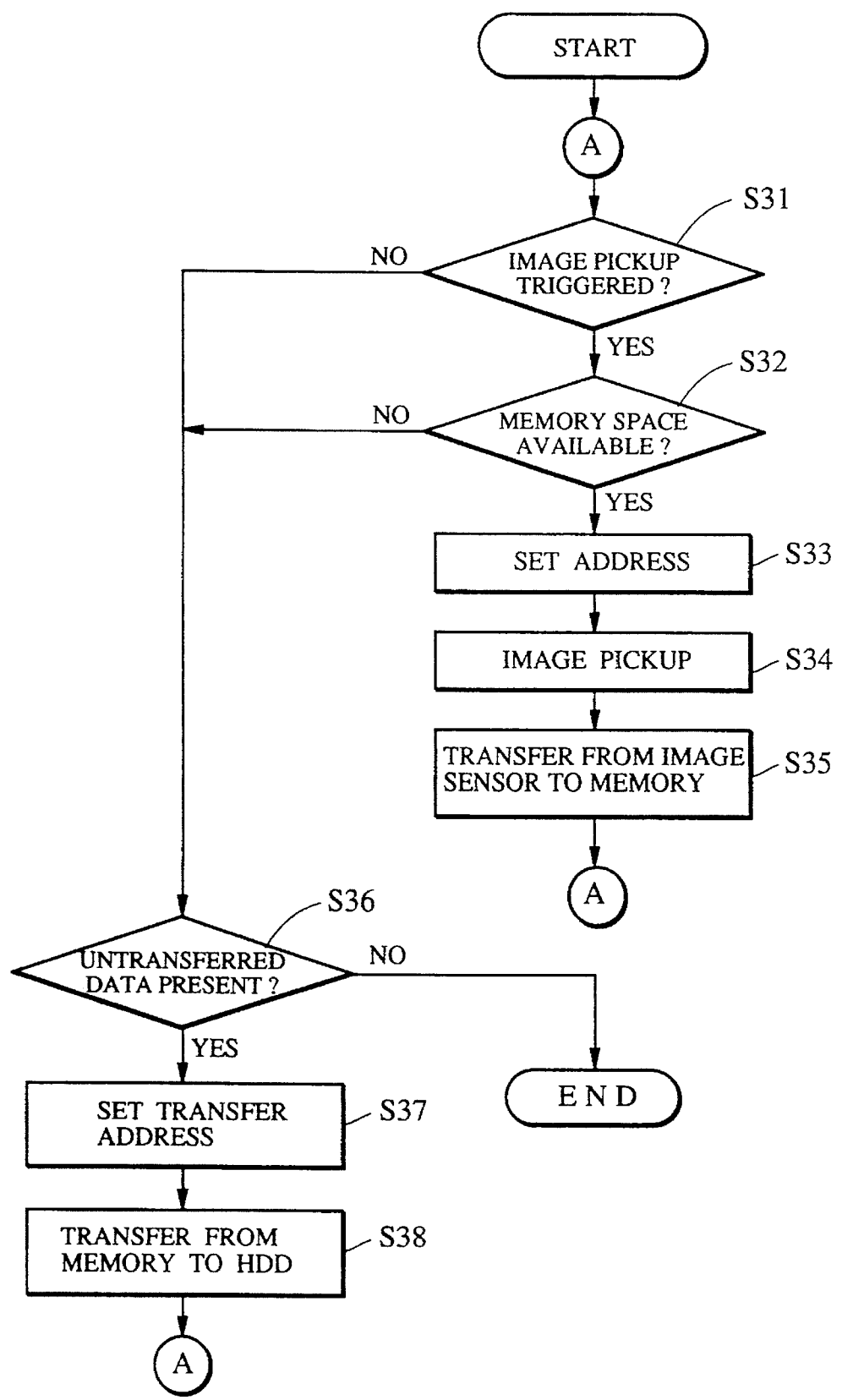
FIG. 15 is a flowchart illustrating the operation of a third embodiment of the present invention.

The third embodiment has the same configuration as that of each of the above embodiments shown in FIGS. 1, 2 and 3, and is characterized by the flowchart shown in FIG. 15.

When data for several images is transferred to the hard disk at a time, new data cannot be read from the solid state image sensor until transfer is completed. Thus, a predetermined amount of data may be transferred to the hard disk at a time. An example in which an image is photographed, and a next image is immediately photographed is described below with reference to FIG. 15.

The image pickup trigger is checked by the switch 11 shown in FIG. 1 in Step S31. If the switch is pushed (turned on), the memory is checked for a space capacity sufficient to photograph one image plane in Step S32. If there is a space capacity, an address region (for example, the region A shown in FIG. 8) of data for one image plane is set in Step S33. The image pickup operation is performed (charge is stored in the solid state image sensor by controlling the shutter and the diaphragm) in Step S34, and the data of the image sensor is transferred to the memory in Step S35. The flow then returns to Step S31. If the image pickup trigger is turned on, and if there is a space in the memory, the image pickup operation (Step S33) is performed. A new address is set in a region (for example, the region B shown in FIG. 8) which is not superposed on the previous image pickup data in Step S34. The pickup data is stored in Step S35. If the memory becomes full, the flow moves from Step S32 to Step S36. If the image pickup trigger is turned off, the flow moves from Step S31 to Step S36.

The memory is checked in Step S36 to see if untransferred data remains. If the untransferred data remains, an address for a predetermined capacity of data is set in Step S37 (to an intermediate portion of the region A shown in FIG. 8, for example, to RAS address 100H and CAS address 200H). A predetermined amount of data is transferred from the memory to the hard disk in Step S38. The flow again returns to Step S31. If the image pickup is triggered, and if there is a space in the memory, the image pickup operation is performed in Step S33, a new address is set in Step S34, and the pickup data is stored in Step S35.

Since the pickup data remains in Step S36, the flow moves to Step S37.

An address is set to be continued from the portion from which data was previously transferred (RAS 101H, CAS 00H) in Step S37. The data is transferred to the hard disk in Step S38, and the flow returns to Step S31.

If the image pickup trigger is turned off in Step S31, the flow moves to Step S36. The processing in Steps S31, S36, S37 and S38 is repeated unless the trigger is turned on. When all data is transferred, the sequence is terminated.

If there is no space in the memory in Step S32, the image pickup operation is not performed, and the flow moves to Step S36. The data is transferred to the hard disk until a sufficient space capacity is produced.

As described above, the image pickup trigger is checked each time data is transferred, and data may be transferred to the memory until no space is present. When all data is completely transferred in Step S36, the operation of this embodiment is terminated.

Although, in the embodiments, the A/D converter has two channels, the A/D converter may have one channel or two or more channels. The memory may have a structure other than the X4 structure. Namely, the number of bits of data from the A/D converter and the number of bits of data transferred to the memory may be determined according to the system concerned. In addition, the memory is not limited to the DRAM, other memory such as SRAM or the like can be used if the cost and circuit scale of the system can be neglected. Further, the present invention can be applied to a system such as HDTV which handles a large amount of data, and usual TV systems such as NTSC and PAL. The second storage medium may be either a hard disk or any one of various types memory cards including DRAM, SRAM, EEPROM and FLASH. The second storage medium may also be fixed to the body or detachable therefrom.

As described above, in the first embodiment, since the DRAM is refreshed immediately after data for several lines is read from the solid state image sensor, read from the solid state image sensor is not stopped in the course of reading of an image, thereby obtaining a good image without the remarked unevenness caused by variations in the storage time of the solid state image sensor.

In the second embodiment, since the dark current is subtracted after a predetermined value is added to the original image, even if noise enters the dark current image, the noise is offset, and the dark current can be subtracted without an adverse effect on the original image. When a pixel of the original image is saturated, since a predetermined value is written at a corresponding address on the memory, the saturated pixel can easily be discriminated in reproduction of the recorded image. The reproduction processing can thus easily be realized for suppressing the color of a high-brightness portion. In addition, dark current data may be stored either before or after an object is photographed according to the system, and the sequence design can be realized with little limitation. Since the object image data is rewritten in the same address region on the memory after the dark current is subtracted from the object image data, a new memory region need not be provided, and the memory capacity can effectively utilized.

In the third to fifth embodiments, since the start and end addresses for the memory are specified, partial write and read can easily performed, and data can thus be divided and then transferred to a medium such as a hard disk or the like. This prevents the shutter chance from being lost by the interruption of image pickup due to data transfer to the hard disk. The embodiments of the present invention can be applied to many other solid state image sensors having different pixel numbers simply by changing the addressing contents for write and read. In this way, since the memory is appropriately controlled while being related to the image sensor and other peripheral devices, the embodiments can easily be applied to a high-definition camera which requires a large volume of data.

What is claimed is:

1. An image processing apparatus comprising:

an image sensor for sensing an optical image and converting the image into image data;

a memory for storing the image data from said image sensor; and refresh signal generation means for refreshing said memory at a first time interval during which no image data is read from said image sensor and at a second time interval during storing of image data from said image sensor, wherein the first time interval is different from said second time interval.

2. An image processing apparatus according to claim 1, wherein said image sensor comprises a solid-state image sensor device.

3. An image processing apparatus according to claim 1, wherein said memory comprises a DRAM.

4. An image processing apparatus comprising:

an image data source for outputting image data;

a memory for storing the image data from said image data source; and refresh signal generating means for refreshing said memory at a first time interval during which no image data from said image data source is being stored and at a second time interval during storing of image data from said image data source, the first time interval being different from the second time interval.

5. An image processing apparatus according to claim 4, wherein said memory comprises a DRAM.

6. An image processing apparatus according to claim 4, wherein said image data source comprises an image pickup means.

7. An image processing apparatus comprising:

memory means for storing image data;

memory control means for controlling said memory means to switch between a transfer mode for transferring image data to/from said memory means, and a maintaining mode for maintaining image data in said memory means; and refresh means for supplying refresh pulses to said memory means, and for changing a time interval of said refresh pulses according to switching between said transfer mode and said maintaining mode.

* * * * *

UNITED STATES PATENT AND TRADEMARK OFFICE
CERTIFICATE OF CORRECTION

PATENT NO. : 5,459,508
DATED : October 17, 1995
INVENTOR(S) : NOBUO FUKUSHIMA

It is certified that error appears in the above-indentified patent and that said Letters Patent is hereby corrected as shown below:

COVER PAGE,

Item 56, after "U.S. Patent Documents" insert
```
--5,150,219   9/1992   Fukushima
  5,218,452   6/1993   Kondo et al.
  4,608,603   8/1986   Johnson
  4,972,376  11/1990   Torimaru, et al.
```
"Foreign Patent Documents"
```
--473516     3/1992   European Patent Office
  2-116081   4/1990   Japan--.
```

COLUMN 8,

Line 2, "micro seconds" should read --microseconds--;
Line 3, "micro" should read --micro- --.

COLUMN 10,

Line 65, "pickup" should read --picked up--.

UNITED STATES PATENT AND TRADEMARK OFFICE
CERTIFICATE OF CORRECTION

PATENT NO. : 5,459,508
DATED : October 17, 1995
INVENTOR(S) : NOBUO FUKUSHIMA

It is certified that error appears in the above-indentified patent and that said Letters Patent is hereby corrected as shown below:

<u>COLUMN 14,</u>

Line 18, "read" (second occurrence) should read --reading--;
   line 67, "said" should read --the--.

Signed and Sealed this

Twenty-first Day of May, 1996

Attest:

BRUCE LEHMAN

Attesting Officer          Commissioner of Patents and Trademarks